(12) United States Patent
Wu

(10) Patent No.: US 8,139,360 B2
(45) Date of Patent: Mar. 20, 2012

(54) MULTI-SPECIFICATION FIXING MODULE AND MOTHERBOARD WITH MULTI-SPECIFICATION FIXING MODULE

(75) Inventor: Chao-Chung Wu, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 168 days.

(21) Appl. No.: 12/640,575

(22) Filed: Dec. 17, 2009

(65) Prior Publication Data

US 2011/0149503 A1   Jun. 23, 2011

(51) Int. Cl.
*H05K 7/20* (2006.01)
(52) U.S. Cl. .......... 361/710; 361/704; 361/719; 361/72; 165/185; 257/718
(58) Field of Classification Search ............... 361/715, 361/717, 718, 719, 704, 709, 710, 720–722
See application file for complete search history.

(56) References Cited

U.S. PATENT DOCUMENTS

| 7,301,774 | B2 * | 11/2007 | Lee et al. | 361/719 |
| 7,460,372 | B2 * | 12/2008 | Liao et al. | 361/704 |
| 7,663,887 | B2 * | 2/2010 | Li | 361/720 |
| 2003/0159819 | A1 * | 8/2003 | Lee | 165/185 |
| 2005/0195572 | A1 * | 9/2005 | Franz et al. | 361/707 |
| 2009/0059530 | A1 * | 3/2009 | Sun et al. | 361/704 |

* cited by examiner

*Primary Examiner* — Jayprakash N Gandhi
*Assistant Examiner* — Courtney Smith
(74) *Attorney, Agent, or Firm* — Jianq Chyun IP Office

(57) ABSTRACT

A multi-specification fixing module used at a motherboard and a cooler. The multi-specification fixing module includes a plurality of the fixing sheet and a specification adjusting base plate. Each of the fixing sheets has a fixing hole. The specification adjusting base plate includes a plurality of adjusting portions at a periphery of the specification adjusting base plate. Each of the adjusting portions has an adjusting guiding rail group and an adjusting portion hole. The positions of the fixing sheets are adjusted according to the size of the cooler body to install the fixing sheets in the adjusting guiding rail groups, and the installing fixing accessories are connectedly fixed at the motherboard holes via the fixing holes and the adjusting portion holes to fix and install the cooler body above the socket.

6 Claims, 5 Drawing Sheets

MULTI-SPECIFICATION FIXING MODULE AND MOTHERBOARD WITH MULTI-SPECIFICATION FIXING MODULE

FIELD OF THE INVENTION

The invention relates to a multi-specification fixing module, more particularly, to a multi-specification fixing module of a motherboard.

BACKGROUND OF THE INVENTION

With the development of electronic digital technology, a computer becomes indispensable to modern people. In term of hardware of a computer system including a desktop computer and a notebook computer, a central processing unit (CPU) as a core of the system is the most important development index in the technology and the industry. Although the CPU is a core component in the system, it also needs to cooperate with other properly configured units to normally operate. For example, the CPU is installed in a corresponding socket of a motherboard supporting the CPU according to its specification, size, and voltage, or after the CPU is installed, the cooler cooperated with the CPU is needed to be utilized to effectively dissipate heat, and thus other components on the motherboard wound not be damaged.

In respect of the structure, the cooler mainly includes units such as a copper base, a copper pipe, an aluminum fin, and a fan to effectively reduce high temperature and dissipate high heat generated from the CPU in operating. In respect of the design, the cooler is preferably disposed on the CPU, which is the most common installing and configuration mode. Since a common CPU is a very precise electronic component, the cooler cannot be installed and fixed on the CPU directly, and it needs to be installed via fixing holes of the motherboard and a fixing pillar with a corresponding size, or a relating fastening structure to contact with the CPU under the cooler to dissipate the heat.

According to current technology, the CPU mainly includes serial products released by Intel, Advanced Micro Devices (AMD) and so on, and corresponding specifications are Intel LGA 1366, 1156, 775 and AMD AM3, AM2+, AM2 and so on. Consequently, relating cooler products need to be designed corresponding to the specifications of the CPUs. The socket of the motherboard for installing the CPU usually is designed to correspond to the pin number or size of a slim CPU. However, since the volume of a common cooler is usually large, not only the sizes of the bottom surfaces of coolers with different specifications are different, the corresponding sizes and installing hole pitches of the fixing holes of the motherboard are also different. As a result, considering the applicability of the cooler, when the motherboard is designed to support various specifications, the fixing holes need to be designed to cooperate with the fixing mode of the cooler to provide enough space to install a corresponding cooler.

FIG. 1A to FIG. 1C are schematic diagrams showing the disposition of various kinds of fixing holes for installing corresponding coolers on a conventional motherboard. In FIG. 1A, only a cooler with a corresponding size or a corresponding specification such as the LGA-1366 can be supported and installed on a motherboard 10. That is, only one of fixing holes a1 to a4 is designed at a corner of the periphery of a socket 101 for the CPU. In FIG. 1B and FIG. 1C, two coolers with corresponding sizes and specifications, respectively, such as the LGA-1366 and LGA-775, or LGA-775 and LGA-1156 may be installed on a motherboard 11 or a motherboard 12, respectively. That is, two of fixing holes a1 to a4 and fixing holes b1 to b4 are designed at a corner of the periphery of the socket 101 for the CPU, respectively. That is, one of the fixing holes a1 to a4 and one of the fixing holes b1 to b4 are designed at each corner of the periphery of a socket 111 and each corner of the periphery of a socket 121, respectively. In FIG. 1B, pairs of fixing holes arranged in a same diagonal are designed at the corners of the periphery of the socket 111. In FIG. 1C, one of a pair of the fixing holes at the corner of the periphery of the socket 121 deviates from the other one, and then the cooler needs to be rotated over the socket 121 corresponding to the positions of the fixing holes to be fixed.

However, different coolers are fixed at the motherboard via four to eight fixing holes passing through the motherboard and corresponding fixing pillars or installation accessories. Consequently, if the fixing holes corresponding to the size of the cooler are not formed on the motherboard, the cooler cannot be installed. If more fixing holes, such as the fixing holes at least including fixing holes with three specifications mentioned in FIG. 1A to FIG. 1C, corresponding to more specifications of coolers are designed on the motherboard, regardless of a same diagonal design or a deviation design for adjacent holes, it is difficult to form the fixing holes at many different positions of the corners at the periphery of the socket on the motherboard. Furthermore, the surrounding components are easily damaged due to an improper perforation design or a corresponding installing process, or the cooler may not achieve the best dissipation efficiency.

SUMMARY OF THE INVENTION

The invention discloses a multi-specification fixing module and a motherboard with a multi-specification fixing module to allow different specifications of coolers to be fixed and installed on a top surface of the motherboard by utilizing the multi-specification fixing module according to the invention.

The invention provides a multi-specification fixing module used at a motherboard and a cooler. The cooler includes a cooler body and a plurality of installing fixing accessories, the motherboard includes a socket, and a plurality of motherboard holes are formed out of the socket. The multi-specification fixing module includes a plurality of the fixing sheet and a specification adjusting base plate. Each of the fixing sheets has a fixing hole. The specification adjusting base plate includes a plurality of adjusting portions at a periphery of the specification adjusting base plate. Each of the adjusting portions has an adjusting guiding rail group and an adjusting portion hole. The positions of the fixing sheets are adjusted according to the size of the cooler body to install the fixing sheets in the adjusting guiding rail groups, and the installing fixing accessories are connectedly fixed at the motherboard holes via the fixing holes and the adjusting portion holes to fix and install the cooler body above the socket.

According to another aspect, the invention discloses a motherboard with a multi-specification fixing module used for installing a cooler. The cooler includes a cooler body and a plurality of installing fixing accessories. The motherboard includes a top surface, a bottom surface, a socket disposed on the top surface, a plurality of motherboard holes formed at a periphery of the socket, a plurality of adjusting portions disposed on the bottom surface corresponding to the motherboard holes, respectively, and a plurality of fixing sheets. Each of the adjusting portions has an adjusting guiding rail and an adjusting portion hole. Each of the fixing sheets has a fixing hole, the positions of the fixing sheets are adjusted according to the size of the cooler body to install the fixing sheets in the adjusting guiding rail groups, and the installing fixing accessories are connectedly fixed at the motherboard holes via the fixing holes and the adjusting portion holes to fix and install the cooler body above the socket.

BRIEF DESCRIPTION OF THE DRAWINGS

These and other features, aspects and advantages of the present invention will become better understood with regard to the following description, appended claims, and accompanying drawings.

DETAILED DESCRIPTION OF THE PREFERRED EMBODIMENT

Figure 1A:
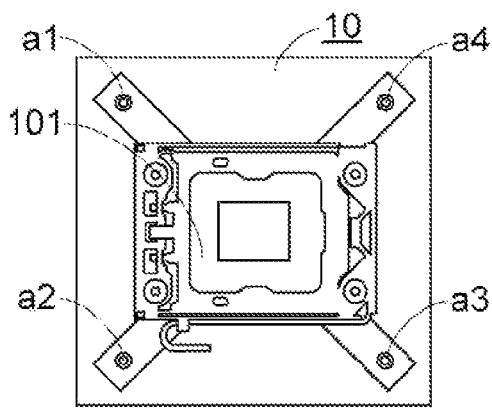
FIG. 1A to FIG. 1C are schematic diagrams showing the disposition of various kinds of fixing holes for installing corresponding coolers on a conventional motherboard.
Figure 1B:
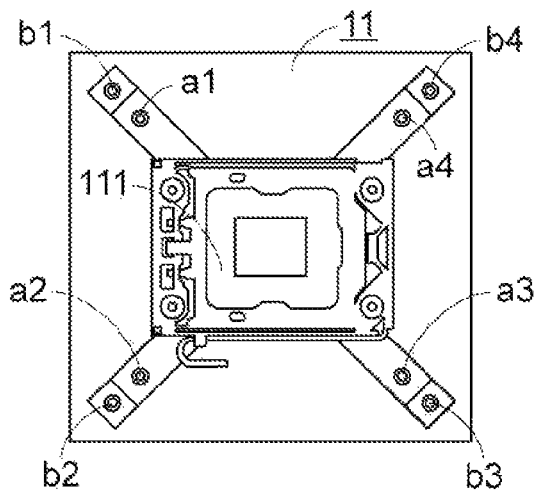
Figure 1C:
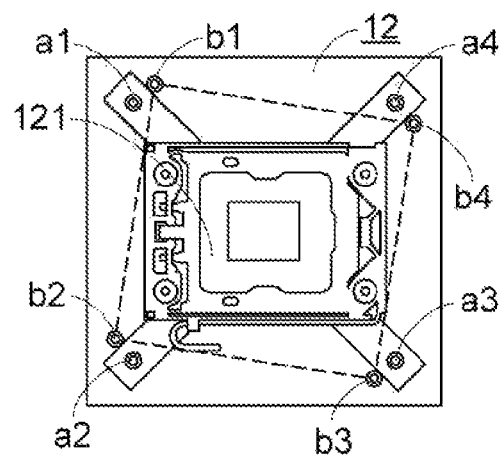
Figure 2A:
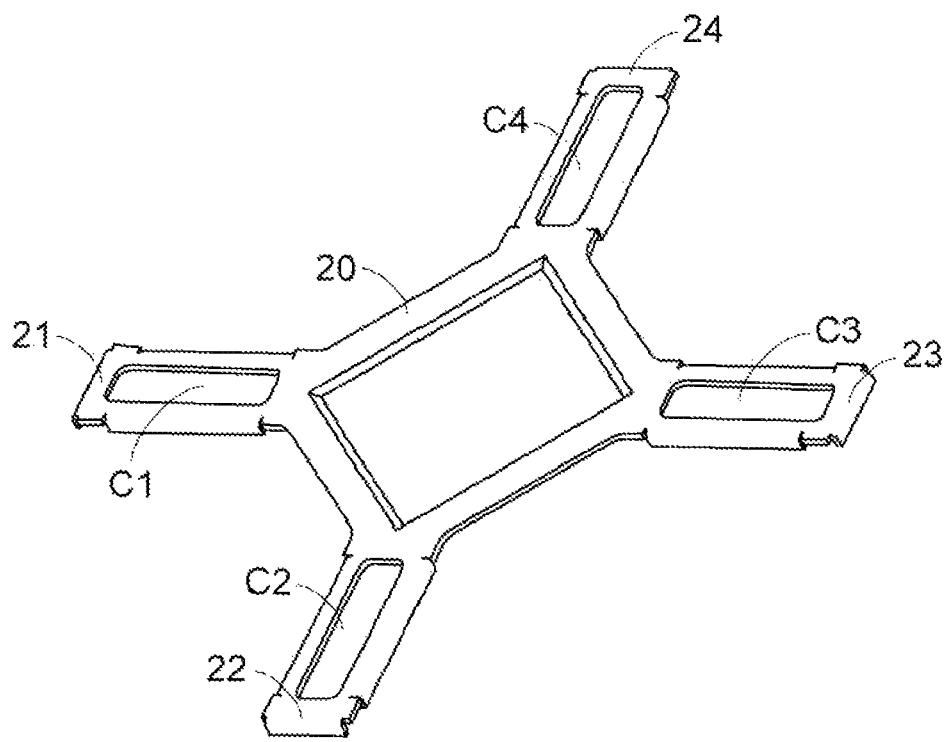
FIG. 2A is a three-dimensional top view showing a specification adjusting base plate of a multi-specification fixing module according to a first embodiment of the invention.
Figure 2B:
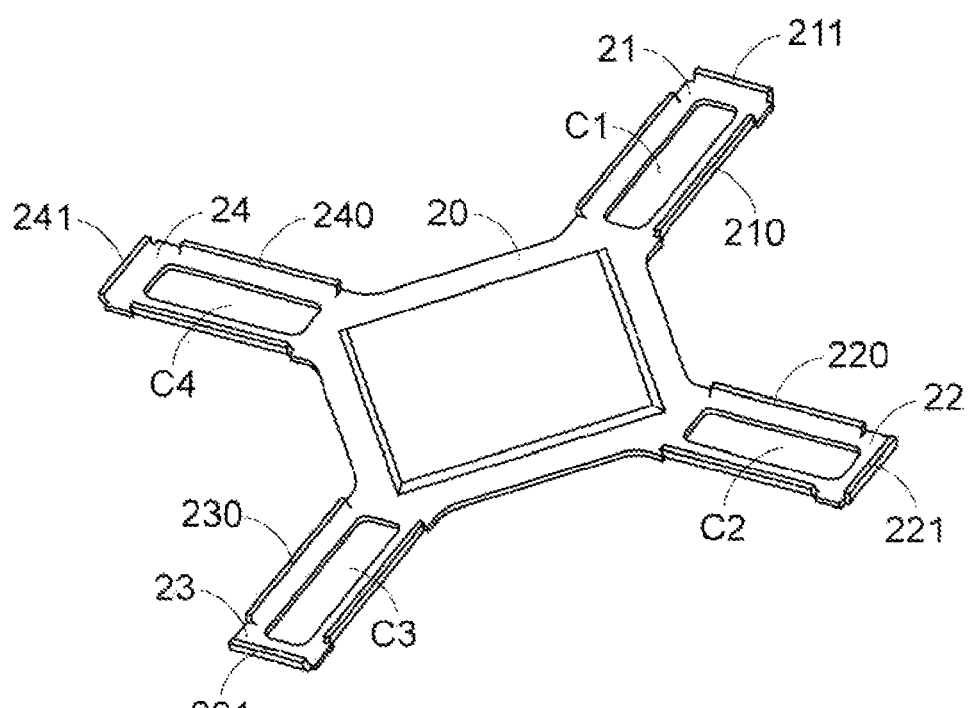
FIG. 2B is a three-dimensional bottom view showing a specification adjusting base plate of a multi-specification fixing module according to a first embodiment of the invention.

FIG. 2A is a three-dimensional top view showing a specification adjusting base plate 20 of a multi-specification fixing module according to a first embodiment of the invention. FIG. 2B is a three-dimensional bottom view showing the specification adjusting base plate 20 of the multi-specification fixing module according to a first embodiment of the invention. As shown in FIG. 2A and FIG. 2B, the specification adjusting base plate 20 further includes four adjusting portions 21 to 24 at the periphery of the specification adjusting base plate 20. That is, the four long-strip adjusting portions 21 to 24 are formed on a same flat board and extend outward in diagonal directions. In this embodiment, the multi-specification fixing module is used at a motherboard and a cooler (not shown), and the motherboard and the cooler may be conventional units. That is, the specification adjusting base plate 20 is fixed at a bottom surface of the motherboard, the specification of the cooler may be one of conventional specifications, and the cooler may be connected with and fixed at the motherboard by utilizing the multi-specification fixing module according to the invention. Furthermore, the multi-specification fixing module according to an embodiment of the invention further includes four fixing sheets which are illustrated hereinafter.

Figure 3:
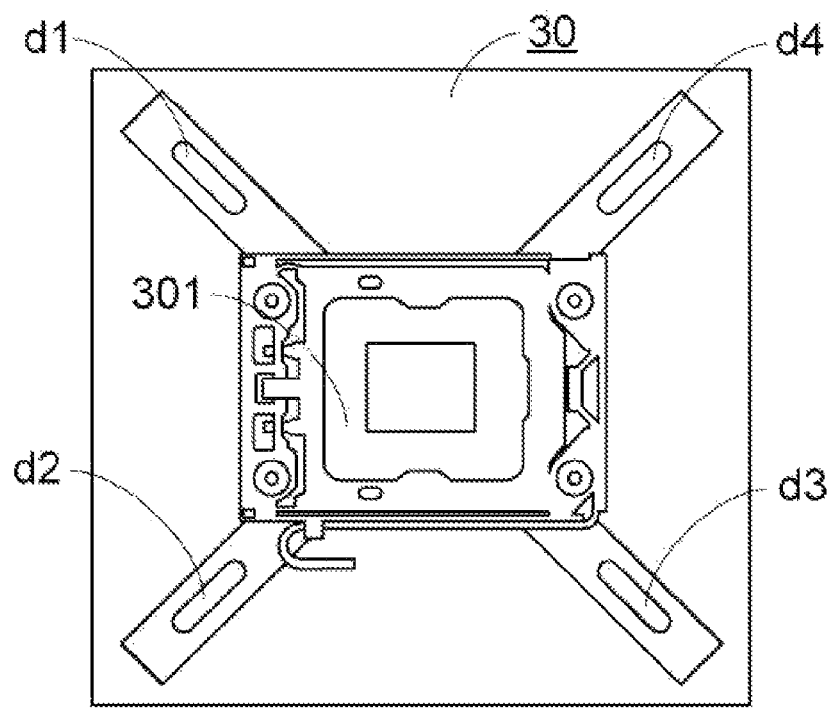
FIG. 3 is a schematic diagram showing a motherboard of a multi-specification fixing module according to a first embodiment of the invention.

In this embodiment, a surface shown in FIG. 2A is taken as a back surface of the specification adjusting base plate 20, and the surface shown in FIG. 2B is taken as a front surface of the specification adjusting base plate 20. In usage, the back surface of the specification adjusting base plate 20 is attached to the bottom surface of the motherboard without relating electronic components to fix the specification adjusting base plate 20. FIG. 3 is a schematic diagram showing a motherboard 30 of a multi-specification fixing module according to a first embodiment of the invention. Correspondingly, as shown in FIG. 3, the motherboard 30 further includes a socket 301 for installing a CPU and disposed on a top surface of the motherboard 30. To cooperate with the specification adjusting base plate 20 according to the embodiment, four motherboard holes d1 to d4 are needed to be designed on the motherboard 30. Detailedly speaking, the motherboard holes d1 to d4 are larger than the fixing holes in conventional technology, and each of the motherboard holes d1 to d4 is formed in the diagonal direction at the periphery of the socket 301.

As shown in FIG. 2A and FIG. 2B, adjusting portion holes c1 to c4 are formed at the centers of the adjusting portions 21 to 24, respectively. When the back surface of the specification adjusting base plate 20 is fixed with the bottom surface of the motherboard 30, the four adjusting portion holes c1 to c4 need to correspond to the four motherboard holes d1 to d4 to perform the following fixing and installation process. The sizes of the motherboard holes d1 to d4 may be the same. Similarly, the sizes of the adjusting portion holes c1 to c4 also may be the same. In respect of usage, the sizes of the adjusting portion holes c1 to c4 should not be less than that of the motherboard holes d1 to d4. In terms of the limited space for forming the holes in the motherboard 30, the sizes of the adjusting portion holes c1 to c4 are preferably larger to facilitate moving and adjusting the positions of the fixing sheets in the following steps.

As a result, the sizes of the motherboard holes d1 to d4 represent the specification of the supported cooler in application. The specifications of the coolers are designed to correspond to those of different CPUs. For example, the sizes of the bottom surfaces or the sizes of installation portions of the coolers with different specifications such as the conventional coolers LGA 1366, 1156, and 775 are different. Detailed fixing mode and design features are illustrated hereinafter.

Figure 4:
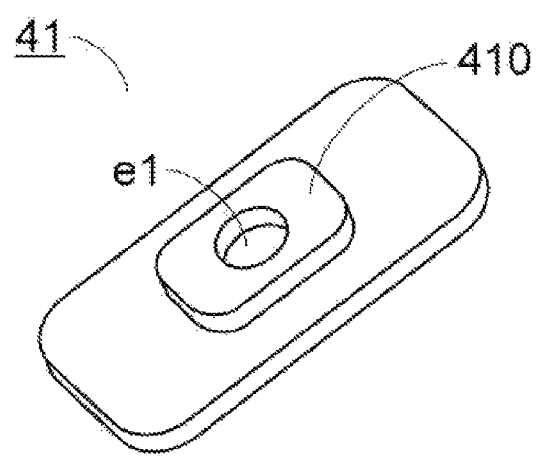
FIG. 4 is a schematic diagram showing a fixing sheet of a multi-specification fixing module according to a first embodiment of the invention.
Figure 5A:
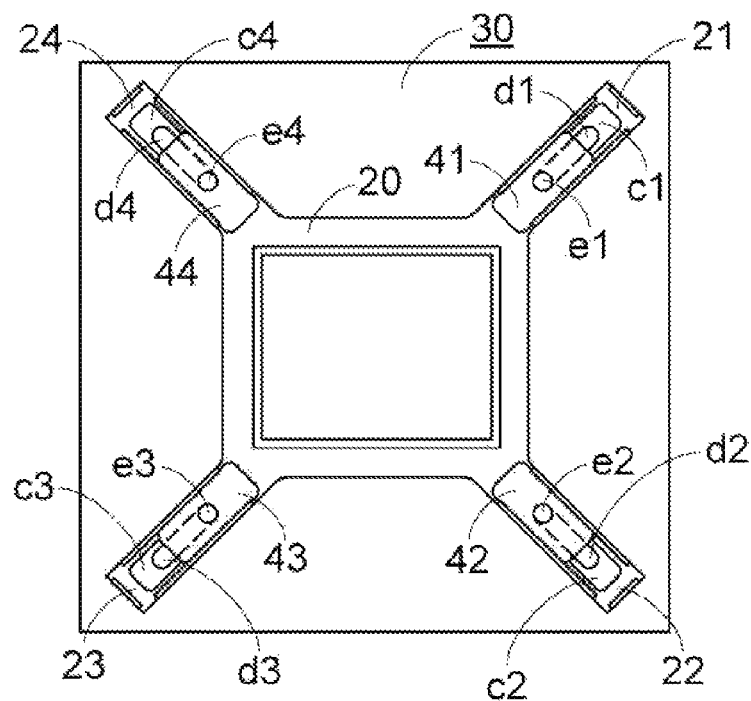
FIG. 5A is a schematic diagram showing a bottom surface of a motherboard where fixing sheets are installed according to a first embodiment of the invention.

As stated above, as shown in FIG. 2B, side edges of each of the adjusting portions 21 to 24 has one of adjusting guiding rail groups 210 to 240, respectively, and an end of each of the adjusting portions 21 to 24 has one of blocking structures 211 to 241, respectively. The adjusting guiding rail groups 210 to 240 are provided for holding the fixing sheets (not shown) of the multi-specification fixing module to adjust and install the coolers with different specification. The multi-specification fixing module further includes four fixing sheets 41 to 44 (as shown in FIG. 5A) installed on the adjusting guiding rail groups 210 to 240, respectively. FIG. 4 is a schematic diagram showing the fixing sheet 41 of a multi-specification fixing module according to a first embodiment of the invention. As shown in FIG. 4, the fixing sheet 41 is long-strip shaped. Moreover, the sizes of the fixing sheets 41 to 44 correspond to the adjusting guiding rail groups 210 to 240. Consequently, not only the fixing sheets 41 to 44 may move in the adjusting guiding rail groups 210 to 240, respectively, and the fixing sheets 41 to 44 also may avoid falling off from the adjusting guiding rail groups 210 to 240 via the adjusting guiding rail groups 210 to 240 where the fixing sheets 41 to 42 are socketed at the side edges, respectively, and the blocking structures 211 to 241 blocking the fixing sheets 41 to 44 on the ends, respectively.

Additionally, as shown in FIG. 4, a protruding structure 410 is disposed at the center of each fixing sheet, and the fixing holes e1 to e4 (as shown in FIG. 5A) are formed in the centers of protruding structures of the fixing sheets, respectively. As a result, when the specification adjusting base plate 20 is fixed at the bottom surface of the motherboard 30, and the fixing sheets 41 to 44 are installed in the adjusting guiding rail groups 210 to 240, respectively, the fixing holes e1 to e4 are provided on the top surface of the motherboard 30 for installing the cooler via the hollow adjusting portion holes c1 to c4 and the motherboard holes d1 to d4.

Figure 5B:
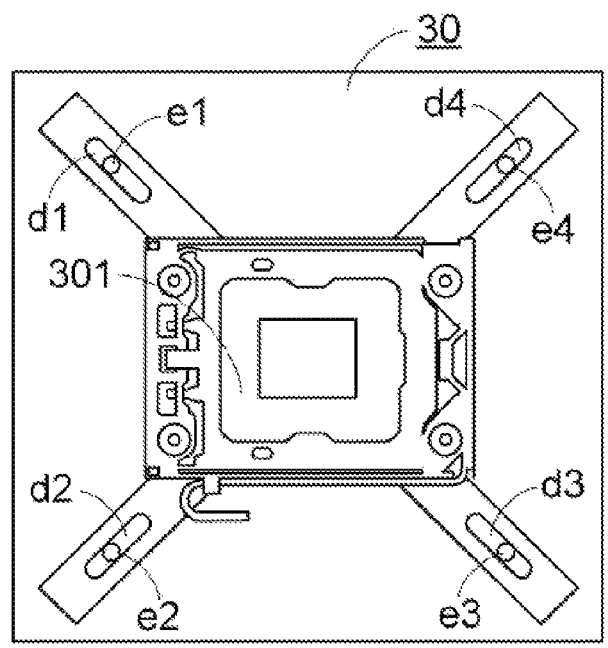
FIG. 5B is a schematic diagram showing a top surface of a motherboard with the installed fixing sheets according to a first embodiment of the invention.

FIG. 5A is a schematic diagram showing the bottom surface of the motherboard 30 where fixing sheets 41 to 44 are installed according to a first embodiment of the invention. FIG. 5B is a schematic diagram showing the top surface of the motherboard 30 with the installed fixing sheets 41 to 44 according to a first embodiment of the invention. The protruding structures of the fixing sheets 41 to 44 have a preset width, and the preset width corresponds to the adjusting portion holes c1 to c4 to limit an adjusting range of the fixing sheets 41 to 44 in the adjusting guiding rail groups 210 to 240. That is, the protruding structures are blocked at the ends of the adjusting portion holes c1 to c4, and thus the movement of the fixing sheets 41 to 44 is restricted. The protruding structures are preferably designed to make the fixing holes e1 to e4 correspond to the whole hollow range of the motherboard holes d1 to d4.

Since the fixing sheets 41 to 44 may parallelly move in the preset range of the adjusting portions 21 to 24, the fixing holes e1 to e4 of the fixing sheets 41 to 44 may be provided for installing relating portions of the cooler. Consequently, the hole pitches between the fixing holes e1 to e4 including the distances in straight lines and the distances in the diagonals may be adjusted to a needed length and the fixing holes e1 to e4 may be adjusted to proper positions according to the size of the bottom surface of the conventional coolers with various specifications.

Figure 6:
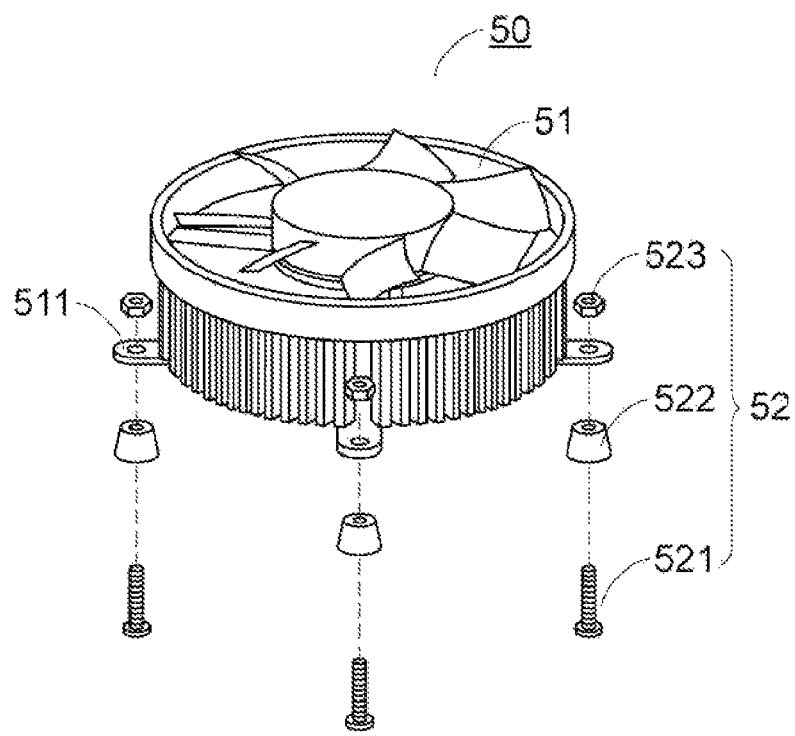
FIG. 6 is a schematic diagram showing a conventional cooler.

FIG. 6 is a schematic diagram showing a conventional cooler 50. As shown in FIG. 6, the cooler 50 includes a cooler body 51 and a plurality of installing fixing accessories 52 for installing the cooler body 51. Detailedly speaking, the installing fixing accessories 52 may be connected with the four installation portions (such as component 511) at the periphery of the cooler body 51 via the relating hole structures. In this embodiment, the installing fixing accessories 52 may be designed to be the same as relating installation accessories of the conventional cooler. For example, as shown in FIG. 6, the installing fixing accessories 52 may include four fixing pillars (such as components 521) or screws, or it may further include the corresponding fixing components such as bases or sleeves 522 and nuts 523. Furthermore, the diameters of the fixing holes e1 to e4 correspond to that of the installing fixing accessories 52. For example, the sizes of the fixing pillars or screws are designed to allow the fixing pillars or screws to pass through the fixing holes e1 to e4 to fasten and connect each other. The diameters of the fixing holes e1 to e4 according to the invention are based on the size of a fixing accessory of the common cooler to meet installation application of technology.

Detailedly speaking, the positions of the fixing holes e1 to e4 are adjusted corresponding to the positions of the four installation portions (such as components 511) of the cooler body 51. That is, the positions of the fixing sheets 41 to 44 are adjusted according to the size of the cooler body 51 to install the fixing sheets 41 to 44 in the adjusting guiding rail groups 210 to 240. When the right position or the right hole pitch are obtained, the cooler body 51 may be disposed above the socket 301 and corresponds to the fixing holes e1 to e4. After the installing fixing accessories 52 (such as the fixing pillars 521) pass through the fixing holes e1 to e4, the adjusting portion holes c1 to c4, and the motherboard holes d1 to d4 to be connected and fixed with the installation portions (such as the components 511), the cooler body 51 is fixed at and installed on the motherboard 30.

As stated in the first embodiment of the invention, the size of the bottom surface or the distances between the installation portions for installing and fixing the cooler of the coolers with different specifications are different. As a result, since the fixing holes e1 to e4 according to the invention can move on the adjusting portions 21 to 24 continuously and fully and the hole pitches can be adjusted, the coolers with different specifications of installing hole pitches can be installed and supported. In respect of the manufacture cost or application cost, when the multi-specification fixing module according to the invention is applied in a relating motherboard, the cooler with a certain specification may be used and installed on different motherboards, and it does not need to be replaced. Detailedly speaking, when the multi-specification fixing module according to the invention is applied on the motherboard, and the fixing holes can be adjusted to provide the cooler body with enough installing space, the cooler with an old specification also may be fixed to work, or and coolers with various old or new specifications may be installed on a same motherboard to work. As a result, an application collocation provided for a user and a manufacture strategy of a manufacturer are more flexible.

In a second embodiment, variations relating to the first embodiment of the invention are illustrated herein. As stated in the first embodiment, the specification adjusting base plate 20 is additionally designed to be applied and fixed on the bottom surface of the motherboard 30, and the corresponding number of the motherboard holes d1 to d4 which should be formed at the periphery of the socket 301 of the applied motherboard 30 corresponds to the specification adjusting base plate 20. The multi-specification fixing module according the first embodiment of the invention is the adjusting portions 21 to 24 and the fixing sheets 41 to 42 correspondingly fixed to the adjusting portions 21 to 24. As a result, an appropriate change is that main units of the multi-specification fixing module are directly designed to be a part of the motherboard, and only the adjusting portions 21 to 24 are disposed on the motherboard in manufacturing.

Figure 7:
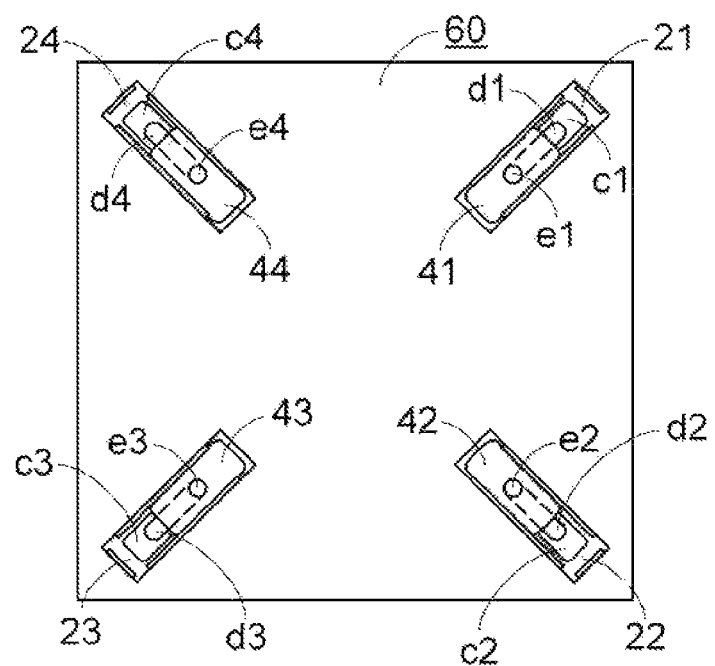
FIG. 7 is a schematic diagram showing a bottom surface of a motherboard using a multi-specification fixing module whose fixing sheets are installed according to a second embodiment of the invention.

FIG. 7 is a schematic diagram showing a bottom surface of a motherboard 60 using a multi-specification fixing module whose fixing sheets 41 to 44 are installed according to a second embodiment of the invention. The same component numbers denote the same components in the first embodiment and the second embodiment. As shown in FIG. 7, the four adjusting portions 21 to 24 are directly disposed on the bottom surface of the motherboard 60 corresponding to the motherboard holes d1 to d4 respectively. Each of the adjusting portions 21 to 24 has the same adjusting portion holes c1 to c4, respectively. In this embodiment, the four fixing sheets 41 to 44 of the motherboard 60 may be directly installed at the adjusting portions 21 to 24 in manufacturing to move and adjust the positions according to the position of the cooler to be installed above the socket. Furthermore, other fixing and installing modes of the cooler are the same as the fixing and installing modes in the first embodiment.

As a result, in the second embodiment, when the multi-specification fixing module is directly designed on the motherboard 60, the user does not need to additionally fix the specification adjusting base plate when he or she assembles relating hardware of the motherboard 60, and he or she can fix and install the prepared cooler body, the installing fixing accessories and so on directly on the motherboard 60. Additionally, the material and manufacture cost of the specification adjusting base plate 20 in the first embodiment is reduced, and only the adjusting portions 21 to 24 with applying effectiveness is used. Furthermore, product features of the motherboard for installing coolers with various specifications are highlighted.

In the above embodiments, the multi-specification fixing module including four fixing sheets and four adjusting portions is taken as an example to illustrate the invention, and the fixing holes, the adjusting portion holes, and the motherboard holes at the periphery of the socket, the fixing pillars of the installing fixing accessories, and the installation portions of the cooler body with a corresponding number are designed at the same time. However, the numbers of relating holes, corresponding fixing and installing units or portions may be designed to be other values such as six or eight. The four-number design is very common. That is, corresponding holes are designed in four diagonal directions at the periphery of the socket, and the installation portions of the cooler body are correspondingly designed in manufacturing. If the numbers of corresponding holes, fixing units, the installation portions are designed to be six or eight, the corresponding holes, fixing units, the installation portions may be correspondingly designed and installed at the straight edges of the periphery of the socket to generate a closer combination effect. Detailed hardware structure with more holes, installation portions, and fixing units may be obtained by varying and applying the concept of above two embodiments of the invention, and the operation and application in fixing and installing also may be the same as those in the above two embodiments.

To sum up, relating usage problems in the conventional technology may be effectively solved according to the invention. That is, the hardware design meeting installation requirements and the specification support for coolers with different specifications are provided on the motherboard. The design concept cooperates with the available space of the motherboard, and thus the surrounding components wound not be damaged when different cooler bodies are fixed to the motherboard. In addition, the hole pitches and the supported positions of the designed fixing holes may be adjusted to be a correct state to make kinds of coolers get best dissipation efficiency. Consequently, the concept of the present invention can successfully obtain development purposes of this technical issue.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A multi-specification fixing module, used at a motherboard and a cooler, wherein the cooler includes a cooler body and a plurality of installing fixing accessories, the motherboard includes a socket, and a plurality of motherboard holes are formed out of the socket, the multi-specification fixing module comprising: a plurality of fixing sheets, wherein each of the fixing sheets has a fixing hole; and a specification adjusting base plate including: a plurality of adjusting portions at a periphery of the specification adjusting base plate, wherein each of the adjusting portions has an adjusting guiding rail group and an adjusting portion hole; wherein when the positions of the fixing sheets are adjusted according to the size of the cooler body to install the fixing sheets in the adjusting guiding rail groups, and the installing fixing accessories are connectedly fixed at the motherboard holes via the fixing holes and the adjusting portion holes, the cooler body is fixed and installed above the socket, the cooler body comprises a plurality of installation portions at the periphery of the cooler body, respectively, the cooler body is connectedly fixed above the socket via the installation portions and the installing fixing accessories, the installing fixing accessories comprises a plurality fixing pillars passing through the fixing holes, the adjusting portion holes, and the motherboard holes to be fixed and installed at the installation portions, respectively.

2. The multi-specification fixing module according to claim 1, wherein the socket is used for installing a central processing unit (CPU).

3. The multi-specification fixing module according to claim 1, wherein that the positions of the fixing sheets are adjusted according to the size of the cooler body to install the fixing sheets in the adjusting guiding rail groups is that the positions of the fixing sheets are adjusted in the adjusting guiding rail groups according to the positions of the installation portions of the cooler body, respectively.

4. The multi-specification fixing module according to claim 1, wherein each of the fixing sheets has a protruding structure, each of the fixing holes is in the center of each of the protruding structures, respectively, the protruding structures have a preset width to limit an adjusting range of the fixing sheets in the adjusting guiding rail groups.

5. The multi-specification fixing module according to claim 1, wherein the hole diameters of the fixing holes correspond to the sizes of the installing fixing accessories.

6. The multi-specification fixing module according to claim 1, wherein an end of each of the adjusting portions has a blocking structure for preventing the fixing sheets from falling off when the fixing sheets are adjusted in the adjusting guiding rail groups.

* * * * *

UNITED STATES PATENT AND TRADEMARK OFFICE
Certificate

Patent No. 8,139,360 B2　　　　　　　　　　　　　　　　　　　　　　　Patented: March 20, 2012

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Chao-Chung Wu, Taipei (TW); and Te-Chi Wang, Taipei (TW).

Signed and Sealed this Twenty-sixth Day of February 2013.

JAYPRAKASH N. GANDHI
*Supervisory Patent Examiner*
Art Unit 2835
Technology Center 2800